US011935600B2

(12) United States Patent
Brewer

(10) Patent No.: US 11,935,600 B2
(45) Date of Patent: Mar. 19, 2024

(54) PROGRAMMABLE ATOMIC OPERATOR RESOURCE LOCKING

(71) Applicant: Micron Technology, Inc., Boise, ID (US)

(72) Inventor: Tony Brewer, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/117,900

(22) Filed: Mar. 6, 2023

(65) Prior Publication Data

US 2023/0215500 A1 Jul. 6, 2023

Related U.S. Application Data

(63) Continuation of application No. 17/075,384, filed on Oct. 20, 2020, now Pat. No. 11,600,332.

(51) Int. Cl.
*G06F 13/16* (2006.01)
*G06F 9/52* (2006.01)
*G06F 12/0815* (2016.01)
*G06F 12/0862* (2016.01)
*G06F 12/0875* (2016.01)
(Continued)

(52) U.S. Cl.
CPC ............ *G11C 16/102* (2013.01); *G06F 9/526* (2013.01); *G06F 12/0815* (2013.01); *G06F 12/0862* (2013.01); *G06F 12/0875* (2013.01); *G06F 13/1605* (2013.01); *G06F 13/1668* (2013.01); *G11C 16/08* (2013.01); *G11C 16/26* (2013.01);
(Continued)

(58) Field of Classification Search
None
See application file for complete search history.

(56) References Cited

U.S. PATENT DOCUMENTS 5,986,564 A 11/1999 Fraser
9,575,890 B2 2/2017 Busaba et al.
(Continued)

FOREIGN PATENT DOCUMENTS

WO WO-2017052801 A1 3/2017
WO WO-2022086772 A1 4/2022

OTHER PUBLICATIONS

"International Application Serial No. PCT/US2021/054735, International Search Report dated Feb. 3, 2022", 4 pgs.
(Continued)

*Primary Examiner* — Michael Sun
(74) *Attorney, Agent, or Firm* — Schwegman Lundberg & Woessner, P.A.

(57) ABSTRACT

Devices and techniques for programmable atomic operator resource locking are described herein. A request for a programmable atomic operator (PAO) can be received at a memory controller that includes a programmable atomic unit (PAU). Here, the request includes an identifier for the PAO and a memory address. The memory addressed is processed to identify a lock value. A verification can be performed to determine that the lock value indicates that there is no lock corresponding to the memory address. Then, the lock value is set to indicate that there is now a lock corresponding to the memory address and the PAO is invoked based on the identifier for the PAO. In response to completion of the PAO, the lock value is set to indicate that there is no longer a lock corresponding to the memory address.

20 Claims, 8 Drawing Sheets

(51) Int. Cl.
*G11C 16/08* (2006.01)
*G11C 16/10* (2006.01)
*G11C 16/26* (2006.01)
*G11C 16/34* (2006.01)

(52) U.S. Cl.
CPC .. *G11C 16/3459* (2013.01); *G06F 2212/1024* (2013.01)

(56) References Cited

U.S. PATENT DOCUMENTS

| | | |
|---|---|---|
| 10,680,809 B2 | 6/2020 | Chang et al. |
| 11,600,332 B2 | 3/2023 | Brewer |
| 2003/0208647 A1* | 11/2003 | Kumar .............. G06F 9/30181 710/200 |
| 2008/0288691 A1 | 11/2008 | Bie et al. |
| 2012/0144119 A1 | 6/2012 | Serebrin et al. |
| 2017/0329635 A1* | 11/2017 | Rathke .................. G06F 30/20 |
| 2018/0322278 A1 | 11/2018 | Hershman et al. |
| 2018/0336035 A1 | 11/2018 | Choi et al. |
| 2019/0107963 A1 | 4/2019 | Bradshaw |
| 2019/0272119 A1 | 9/2019 | Brewer |
| 2022/0122668 A1 | 4/2022 | Brewer |

OTHER PUBLICATIONS

"International Application Serial No. PCT/US2021/054735, Written Opinion dated Feb. 3, 2022", 4 pgs.

"International Application Serial No. PCT/US2021/054735, International Preliminary Report on Patentability dated May 4, 2023", 6 pgs.

* cited by examiner

PROGRAMMABLE ATOMIC OPERATOR RESOURCE LOCKING

PRIORITY APPLICATION

This application is a continuation of U.S. application Ser. No. 17/075,384, filed Oct. 20, 2020, which is incorporated herein by reference in its entirety.

STATEMENT REGARDING GOVERNMENT SUPPORT

This invention was made with U.S. Government support under Agreement No. HR00111890003, awarded by DARPA. The U.S. Government has certain rights in the invention.

BACKGROUND

Chiplets are an emerging technique for integrating various processing functionalities. Generally, a chiplet system is made up of discrete modules (each a "chiplet") that are integrated on an interposer, and in many examples interconnected as desired through one or more established networks, to provide a system with the desired functionality. The interposer and included chiplets can be packaged together to facilitate interconnection with other components of a larger system. Each chiplet can include one or more individual integrated circuits (ICs), or "chips", potentially in combination with discrete circuit components, and commonly coupled to a respective substrate to facilitate attachment to the interposer. Most or all chiplets in a system will be individually configured for communication through the one or more established networks.

The configuration of chiplets as individual modules of a system is distinct from such a system being implemented on single chips that contain distinct device blocks (e.g., intellectual property (IP) blocks) on one substrate (e.g., single die), such as a system-on-a-chip (SoC), or multiple discrete packaged devices integrated on a printed circuit board (PCB). In general, chiplets provide better performance (e.g., lower power consumption, reduced latency, etc.) than discrete packaged devices, and chiplets provide greater production benefits than single die chips. These production benefits can include higher yields or reduced development costs and time.

Chiplet systems can include, for example, one or more application (or processor) chiplets and one or more support chiplets. Here, the distinction between application and support chiplets is simply a reference to the likely design scenarios for the chiplet system. Thus, for example, a synthetic vision chiplet system can include, by way of example only, an application chiplet to produce the synthetic vision output along with support chiplets, such as a memory controller chiplet, a sensor interface chiplet, or a communication chiplet. In a typical use case, the synthetic vision designer can design the application chiplet and source the support chiplets from other parties. Thus, the design expenditure (e.g., in terms of time or complexity) is reduced because by avoiding the design and production of functionality embodied in the support chiplets. Chiplets also support the tight integration of IP blocks that can otherwise be difficult, such as those manufactured using different processing technologies or using different feature sizes (or utilizing different contact technologies or spacings). Thus, multiple IC's or IC assemblies, with different physical, electrical, or communication characteristics can be assembled in a modular manner to provide an assembly providing desired functionalities. Chiplet systems can also facilitate adaptation to suit needs of different larger systems into which the chiplet system will be incorporated. In an example, IC's or other assemblies can be optimized for the power, speed, or heat generation for a specific function—as can happen with sensors—can be integrated with other devices more easily than attempting to do so on a single die. Additionally, by reducing the overall size of the die, the yield for chiplets tends to be higher than that of more complex, single die devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
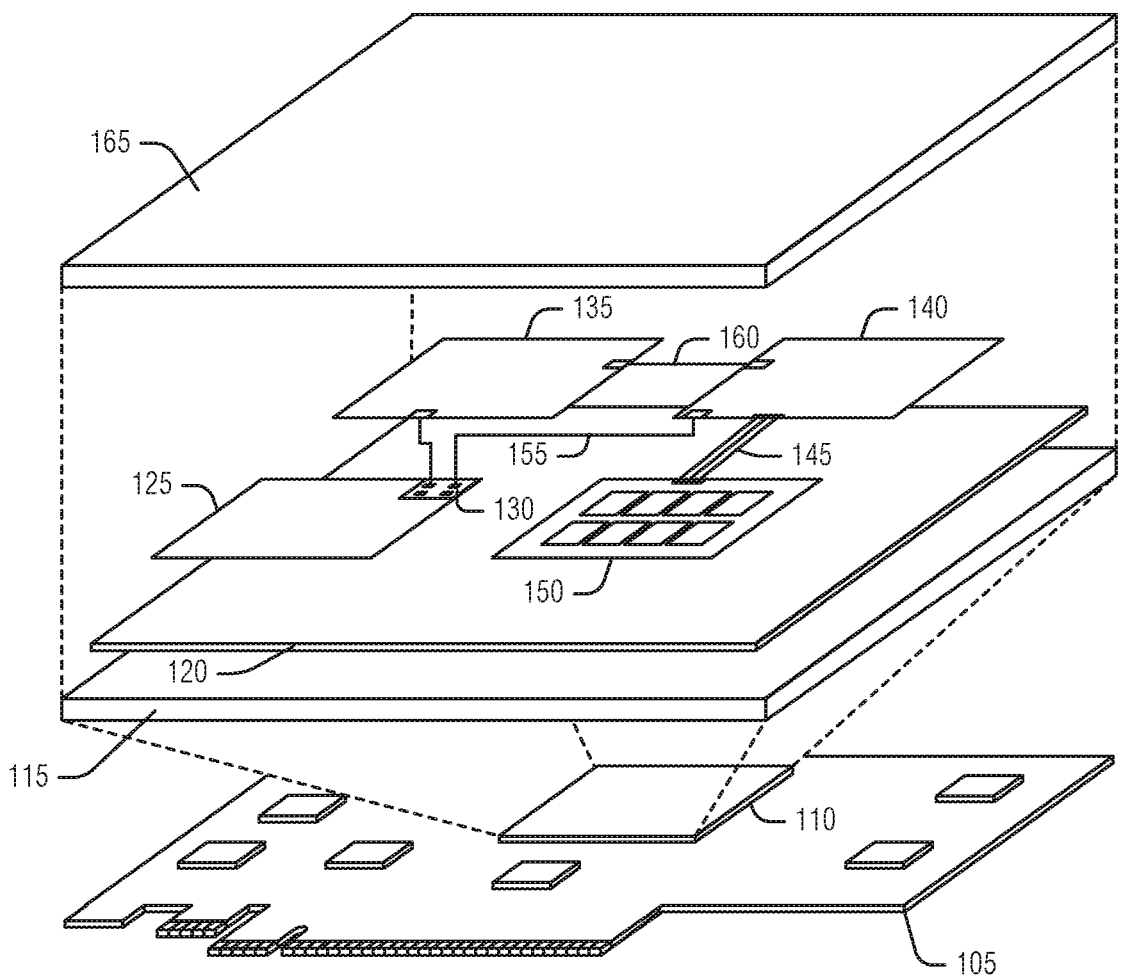
FIGS. 1A and 1B illustrate an example of a chiplet system, according to an embodiment.

FIG. 1, described below, offers an example of a chiplet system and the components operating therein. The illustrated chiplet system includes a memory controller. The chiplet system includes a packet-based network to communicate between chiplets. The memory controller includes a programmable atomic unit (PAU) with a processor to execute a custom program, a programmable atomic operator (PAO), in response to a memory request for the programmable atomic operator. Additional details about the PAU are described below with respect to FIGS. 2 and 4.

To be "atomic" an atomic operator exclusively modifies resources (e.g., data in memory). Thus, given two atomic operators with respect to the same resources, one operator must begin and end operation before the second can begin. Accordingly, an exclusivity mechanism for resources operated on by an atomic operator is needed.

The exclusivity mechanism can be implemented using a base address in a PAO request as an identifier for the resources. Generally, the PAO request includes at least one memory address that can be used to define the data upon which the PAO should operate. However, there is no requirement that the PAO actually access the data at the memory address. Rather, the PAO can access data in relation to this base address. Further, the PAO can use other resources, such as built-in atomics, cryptography components, etc., all of which can represent resources to which the PAO should have exclusive access during its operation. Even though the PAO does not necessarily access the base address, the base memory address in the PAO request is used to represent all of the resources of the PAO for which exclusivity is enforced.

The base memory address of the PAO request is used as a lock, or hazard, address for the PAO. The base memory address can be hashed—for example by a hazard component of the memory controller or by the PAU—to an index. In an example, the index is of an array of lock bits. In these examples, a PAO proceeds with execution when the lock bit at the index determined from hashing the base memory address is unset (e.g., unlocked). Here, the lock bit can be successfully set as the PAO is readied for execution. A subsequent PAO with the same index cannot set the lock bit until the lock is cleared. Once a PAO completes, the lock bit is cleared, enabling waiting PAOs to proceed. In an example, the hashing function uses all address bits from the base memory address to generate the lock array index. This approach can ensure a minimal number of hash result collisions on a given set of PAO addresses.

The exclusivity mechanism described herein, can operate as follows when in operation. When a PAO request is received by a memory controller, the memory address in the PAO is hashed into an index for an array of lock bits. If the lock bit is a logical zero, then the lock bit is set to a logical one and the PAO is started in the PAU. When the PAO complete, the lock bit is cleared (e.g., set back to a logical zero). If the lock bit is already set when the PAO request is received by the memory controller, then the PAO request is linked to the lock bit and paused until the lock bit is cleared. Multiple PAO requests can be linked to the same lock bit. This results in a sequential execution of the PAO requests so linked to the lock bit, providing atomicity. The resource exclusivity mechanism leverages the memory address provided in the PAO request as both a lock address and a base address for the PAO even though the actual operation, and thus resources used, by the PAO is not known when the hardware is designed. Additional details and examples are provided below.

Figure 1B:
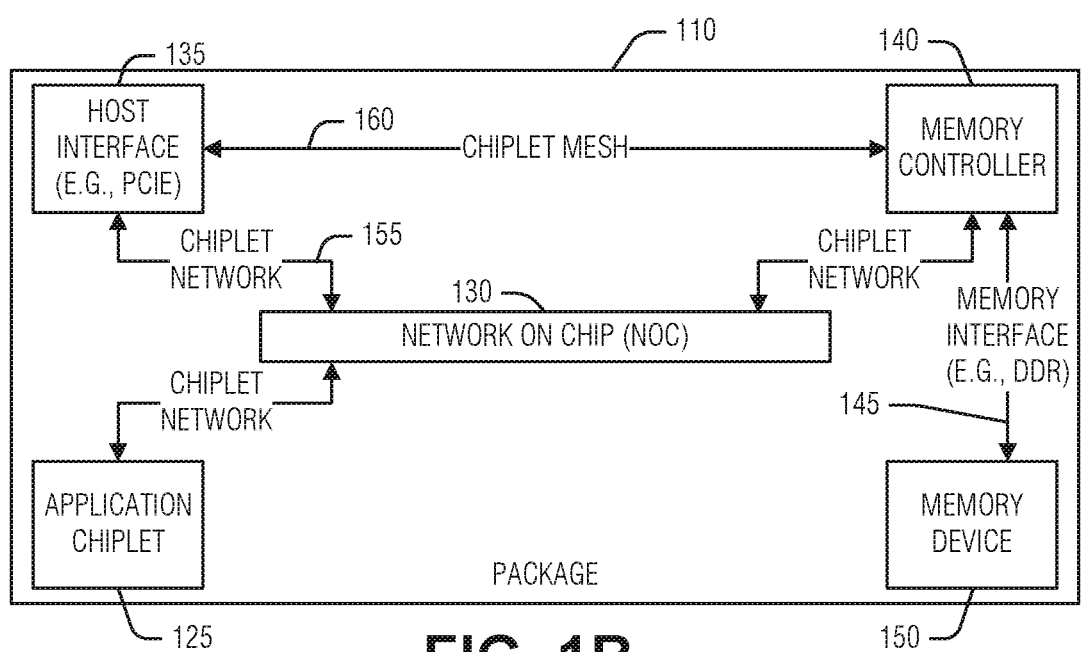

FIGS. 1A and 1B illustrate an example of a chiplet system 110, according to an embodiment. FIG. 1A is a representation of the chiplet system 110 mounted on a peripheral board 105, that can be connected to a broader computer system by a peripheral component interconnect express (PCIe), for example. The chiplet system 110 includes a package substrate 115, an interposer 120, and four chiplets, an application chiplet 125, a host interface chiplet 135, a memory controller chiplet 140, and a memory device chiplet 150. Other systems can include many additional chiplets to provide additional functionalities as will be apparent from the following discussion. The package of the chiplet system 110 is illustrated with a lid or cover 165, though other packaging techniques and structures for the chiplet system can be used. FIG. 1B is a block diagram labeling the components in the chiplet system for clarity.

The application chiplet 125 is illustrated as including a network-on-chip (NOC) 130 to support a chiplet network 155 for inter-chiplet communications. In example embodiments NOC 130 can be included on the application chiplet 125. In an example, NOC 130 can be defined in response to selected support chiplets (e.g., chiplets 135, 140, and 150) thus enabling a designer to select an appropriate number or chiplet network connections or switches for the NOC 130. In an example, the NOC 130 can be located on a separate chiplet, or even within the interposer 120. In examples as discussed herein, the NOC 130 implements a chiplet protocol interface (CPI) network.

The CPI is a packet-based network that supports virtual channels to enable a flexible and high-speed interaction between chiplets. CPI enables bridging from intra-chiplet networks to the chiplet network 155. For example, the Advanced eXtensible Interface (AXI) is a widely used specification to design intra-chip communications. AXI specifications, however, cover a great variety of physical design options, such as the number of physical channels, signal timing, power, etc. Within a single chip, these options are generally selected to meet design goals, such as power consumption, speed, etc. However, to achieve the flexibility of the chiplet system, an adapter, such as CPI, is used to interface between the various AXI design options that can be implemented in the various chiplets. By enabling a physical channel to virtual channel mapping and encapsulating time-based signaling with a packetized protocol, CPI bridges intra-chiplet networks across the chiplet network 155.

CPI can use a variety of different physical layers to transmit packets. The physical layer can include simple conductive connections, or can include drivers to increase the voltage, or otherwise facilitate transmitting the signals over longer distances. An example of one such physical layer can include the Advanced Interface Bus (AIB), which in various examples, can be implemented in the interposer 120. AIB transmits and receives data using source synchronous data transfers with a forwarded clock. Packets are transferred across the AIB at single data rate (SDR) or dual data rate (DDR) with respect to the transmitted clock. Various channel widths are supported by AIB. AIB channel widths are in multiples of 20 bits when operated in SDR mode (20, 40, 60, ... ), and multiples of 40 bits for DDR mode: (40, 80, 120, ... ). The AIB channel width includes both transmit and receive signals. The channel can be configured to have a symmetrical number of transmit (TX) and receive (RX) input/outputs (I/Os), or have a non-symmetrical number of transmitters and receivers (e.g., either all transmitters or all receivers). The channel can act as an AIB principal or subordinate depending on which chiplet provides the principal clock. AIB I/O cells support three clocking modes: asynchronous (i.e. non-clocked), SDR, and DDR. In various examples, the non-clocked mode is used for clocks and some control signals. The SDR mode can use dedicated SDR only I/O cells, or dual use SDR/DDR I/O cells.

In an example, CPI packet protocols (e.g., point-to-point or routable) can use symmetrical receive and transmit I/O cells within an AIB channel. The CPI streaming protocol allows more flexible use of the AIB I/O cells. In an example, an AIB channel for streaming mode can configure the I/O cells as all TX, all RX, or half TX and half RX. CPI packet protocols can use an AIB channel in either SDR or DDR operation modes. In an example, the AIB channel is configured in increments of 80 I/O cells (i.e. 40 TX and 40 RX) for SDR mode and 40 I/O cells for DDR mode. The CPI streaming protocol can use an AIB channel in either SDR or DDR operation modes. Here, in an example, the AIB channel is in increments of 40 I/O cells for both SDR and DDR modes. In an example, each AIB channel is assigned a unique interface identifier. The identifier is used during CPI reset and initialization to determine paired AIB channels across adjacent chiplets. In an example, the interface identifier is a 20-bit value comprising a seven-bit chiplet identifier, a seven-bit column identifier, and a six-bit link identifier. The AIB physical layer transmits the interface identifier using an AIB out-of-band shift register. The 20-bit interface identifier is transferred in both directions across an AIB interface using bits 32-51 of the shift registers.

AIB defines a stacked set of AIB channels as an AIB channel column. An AIB channel column has some number of AIB channels, plus an auxiliary channel. The auxiliary channel contains signals used for AIB initialization. All AIB channels (other than the auxiliary channel) within a column are of the same configuration (e.g., all TX, all RX, or half TX and half RX, as well as having the same number of data I/O signals). In an example, AIB channels are numbered in continuous increasing order starting with the AIB channel adjacent to the AUX channel. The AIB channel adjacent to the AUX is defined to be AIB channel zero.

Generally, CPI interfaces on individual chiplets can include serialization-deserialization (SERDES) hardware. SERDES interconnects work well for scenarios in which high-speed signaling with low signal count are desirable. SERDES, however, can result in additional power consumption and longer latencies for multiplexing and demultiplexing, error detection or correction (e.g., using block level cyclic redundancy checking (CRC)), link-level retry, or forward error correction. However, when low latency or energy consumption is a primary concern for ultra-short reach, chiplet-to-chiplet interconnects, a parallel interface with clock rates that allow data transfer with minimal latency can be utilized. CPI includes elements to minimize both latency and energy consumption in these ultra-short reach chiplet interconnects.

For flow control, CPI employs a credit-based technique. A recipient, such as the application chiplet 125, provides a sender, such as the memory controller chiplet 140, with credits that represent available buffers. In an example, a CPI recipient includes a buffer for each virtual channel for a given time-unit of transmission. Thus, if the CPI recipient supports five messages in time and a single virtual channel, the recipient has five buffers arranged in five rows (e.g., one row for each unit time). If four virtual channels are supported, then the recipient has twenty buffers arranged in five rows. Each buffer holds the payload of one CPI packet.

When the sender transmits to the recipient, the sender decrements the available credits based on the transmission. Once all credits for the recipient are consumed, the sender stops sending packets to the recipient. This ensures that the recipient always has an available buffer to store the transmission.

As the recipient processes received packets and frees buffers, the recipient communicates the available buffer space back to the sender. This credit return can then be used by the sender allow transmitting of additional information.

Also illustrated is a chiplet mesh network 160 that uses a direct, chiplet-to-chiplet technique without the need for the NOC 130. The chiplet mesh network 160 can be implemented in CPI, or another chiplet-to-chiplet protocol. The chiplet mesh network 160 generally enables a pipeline of chiplets where one chiplet serves as the interface to the pipeline while other chiplets in the pipeline interface only with themselves.

Additionally, dedicated device interfaces, such as one or more industry standard memory interfaces 145 (such as, for example, synchronous memory interfaces, such as DDR5, DDR 6), can also be used to interconnect chiplets. Connection of a chiplet system or individual chiplets to external devices (such as a larger system can be through a desired interface (for example, a PCIE interface). Such as external interface can be implemented, in an example, through a host interface chiplet 135, which in the depicted example, provides a PCIE interface external to chiplet system 110. Such dedicated interfaces 145 are generally employed when a convention or standard in the industry has converged on such an interface. The illustrated example of a Double Data Rate (DDR) interface 145 connecting the memory controller chiplet 140 to a dynamic random access memory (DRAM) memory device 150 is just such an industry convention.

Of the variety of possible support chiplets, the memory controller chiplet 140 is likely present in the chiplet system 110 due to the near omnipresent use of storage for computer processing as well as sophisticated state-of-the-art for memory devices. Thus, using memory device chiplets 150 and memory controller chiplets 140 produced by others gives chiplet system designers access to robust products by sophisticated producers. Generally, the memory controller chiplet 140 provides a memory device specific interface to read, write, or erase data. Often, the memory controller chiplet 140 can provide additional features, such as error detection, error correction, maintenance operations, or atomic operator execution. For some types of memory, maintenance operations tend to be specific to the memory device 150, such as garbage collection in NAND flash or storage class memories, temperature adjustments (e.g., cross temperature management) in NAND flash memories. In an example, the maintenance operations can include logical-to-physical (L2P) mapping or management to provide a level of indirection between the physical and logical representation of data. In other types of memory, for example DRAM, some memory operations, such as refresh can be controlled by a host processor or of a memory controller at some times, and at other times controlled by the DRAM memory device, or by logic associated with one or more DRAM devices, such as an interface chip (in an example, a buffer).

Atomic operators are a data manipulation that, for example, can be performed by the memory controller chiplet 140. In other chiplet systems, the atomic operators can be performed by other chiplets. For example, an atomic operator of "increment" can be specified in a command by the application chiplet 125, the command including a memory address and possibly an increment value. Upon receiving the command, the memory controller chiplet 140 retrieves a number from the specified memory address, increments the number by the amount specified in the command, and stores the result. Upon a successful completion, the memory controller chiplet 140 provides an indication of the commands success to the application chiplet 125. Atomic operators avoid transmitting the data across the chiplet network 160, resulting in lower latency execution of such commands.

Atomic operators can be classified as built-in atomics or programmable (e.g., custom) atomics. Built-in atomics are a finite set of operations that are immutably implemented in hardware. Programmable atomics are small programs that can execute on a programmable atomic unit (PAU) (e.g., a custom atomic unit (CAU)) of the memory controller chiplet 140. FIG. 1 illustrates an example of a memory controller chiplet that discusses a PAU.

The memory device chiplet 150 can be, or include any combination of, volatile memory devices or non-volatile memories. Examples of volatile memory devices include, but are not limited to, random access memory (RAM)—such as DRAM) synchronous DRAM (SDRAM), graphics double data rate type 6 SDRAM (GDDR6 SDRAM), among others. Examples of non-volatile memory devices include, but are not limited to, negative-and-(NAND)-type flash memory, storage class memory (e.g., phase-change memory or memristor based technologies), ferroelectric RAM (FeRAM), among others. The illustrated example includes the memory device 150 as a chiplet, however, the memory device 150 can reside elsewhere, such as in a different package on the peripheral board 105. For many applications, multiple memory device chiplets can be provided. In an example, these memory device chiplets can each implement one or multiple storage technologies. In an example, a memory chiplet can include, multiple stacked memory die of different technologies, for example one or more static random access memory (SRAM) devices stacked or otherwise in communication with one or more dynamic random access memory (DRAM) devices. Memory controller 140 can also serve to coordinate operations between multiple memory chiplets in chiplet system 110; for example, to utilize one or more memory chiplets in one or more levels of cache storage, and to use one or more additional memory chiplets as main memory. Chiplet system 110 can also include multiple memory controllers 140, as can be used to provide memory control functionality for separate processors, sensors, networks, etc. A chiplet architecture, such as chiplet system 110 offers advantages in allowing adaptation to different memory storage technologies; and different memory interfaces, through updated chiplet configurations, without requiring redesign of the remainder of the system structure.

Figure 2:
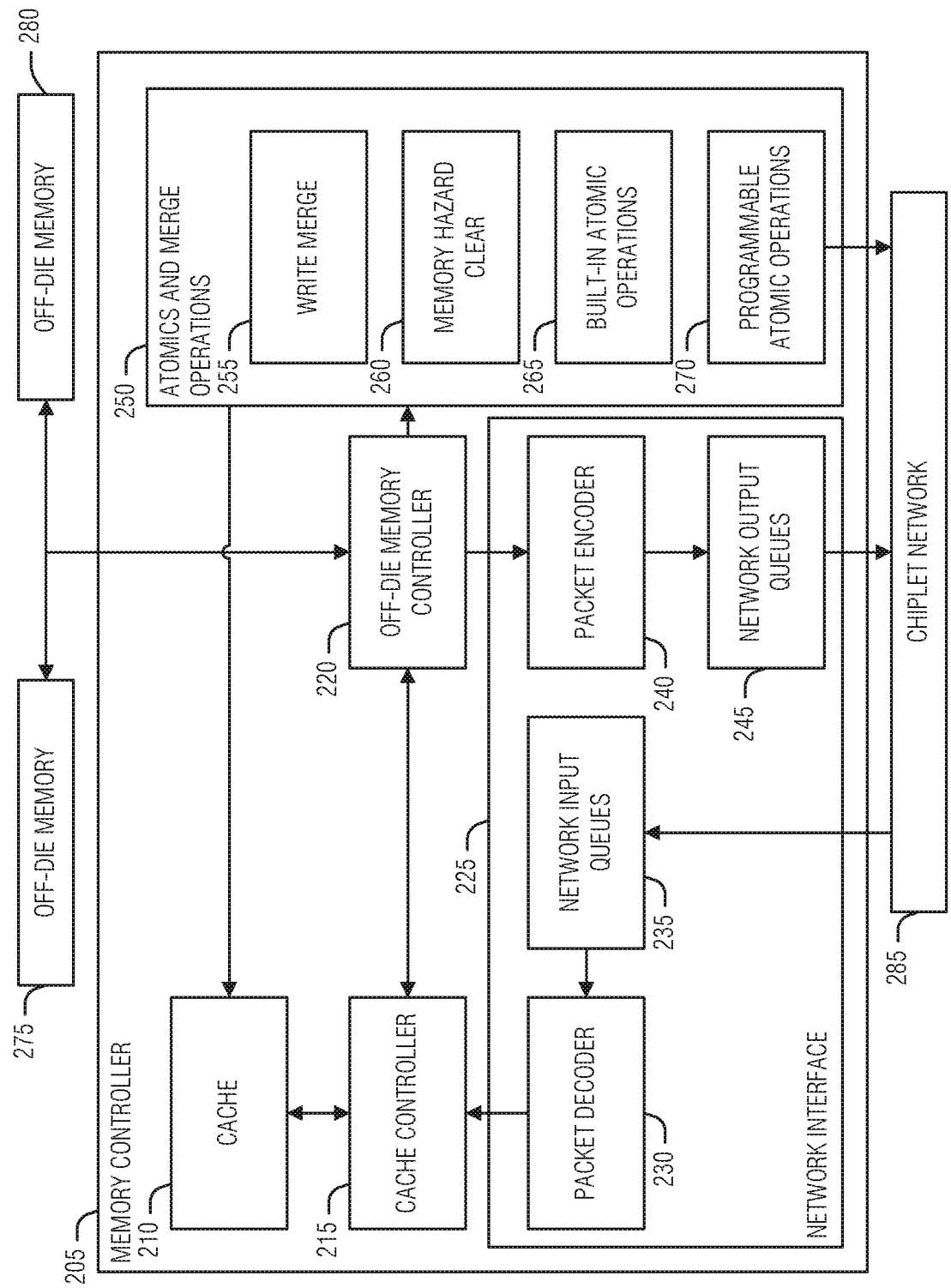
FIG. 2 illustrates components of an example of a memory controller chiplet, according to an embodiment.

FIG. 2 illustrates components of an example of a memory controller chiplet 205, according to an embodiment. The memory controller chiplet 205 includes a cache 210, a cache controller 215, an off-die memory controller 220 (e.g., to communicate with off-die memory 275), a network communication interface 225 (e.g., to interface with a chiplet network 285 and communicate with other chiplets), and a set of atomic and merge units 250. Members of this set can include, for example, a write merge unit 255, a memory hazard unit 260, built-in atomic unit 265, or a PAU 270. The various components are illustrated logically, and not as they necessarily would be implemented. For example, the built-in atomic unit 265 likely comprises different devices along a path to the off-die memory. For example, the built-in atomic unit 265 could be in an interface device/buffer on a memory chiplet, as discussed above. In contrast, the programmable atomic unit 270 could be implemented in a separate processor on the memory controller chiplet 205 (but in various examples can be implemented in other locations, for example on a memory chiplet).

The off-die memory controller 220 is directly coupled to the off-die memory 275 (e.g., via a bus or other communication connection) to provide write operations and read operations to and from the one or more off-die memory, such as off-die memory 275 and off-die memory 280. In the depicted example, the off-die memory controller 220 is also coupled for output to the atomic and merge unit 250, and for input to the cache controller 215 (e.g., a memory side cache controller).

In the example configuration, cache controller 215 is directly coupled to the cache 210, and can be coupled to the network communication interface 225 for input (such as incoming read or write requests), and coupled for output to the off-die memory controller 220.

The network communication interface 225 includes a packet decoder 230, network input queues 235, a packet encoder 240, and network output queues 245 to support a packet-based chiplet network 285, such as CPI. The chiplet network 285 can provide packet routing between and among processors, memory controllers, hybrid threading processors, configurable processing circuits, or communication interfaces. In such a packet-based communication system, each packet typically includes destination and source addressing, along with any data payload or instruction. In an example, the chiplet network 285 can be implemented as a collection of crossbar switches having a folded Clos configuration, or a mesh network providing for additional connections, depending upon the configuration.

In various examples, the chiplet network 285 can be part of an asynchronous switching fabric. Here, a data packet can be routed along any of various paths, such that the arrival of any selected data packet at an addressed destination can occur at any of multiple different times, depending upon the routing. Additionally, chiplet network 285 can be implemented at least in part as a synchronous communication network, such as a synchronous mesh communication network. Both configurations of communication networks are contemplated for use for examples in accordance with the present disclosure.

The memory controller chiplet 205 can receive a packet having, for example, a source address, a read request, and a physical address. In response, the off-die memory controller 220 or the cache controller 215 will read the data from the specified physical address (which can be in the off-die memory 275 or in the cache 210), and assemble a response packet to the source address containing the requested data. Similarly, the memory controller chiplet 205 can receive a packet having a source address, a write request, and a physical address. In response, the memory controller chiplet 205 will write the data to the specified physical address (which can be in the cache 210 or in the off-die memories 275 or 280), and assemble a response packet to the source address containing an acknowledgement that the data was stored to a memory.

Thus, the memory controller chiplet 205 can receive read and write requests via the chiplet network 285 and process the requests using the cache controller 215 interfacing with the cache 210, if possible. If the request cannot be handled by the cache controller 215, the off-die memory controller 220 handles the request by communication with the off-die memories 275 or 280, the atomic and merge unit 250, or both. As noted above, one or more levels of cache can also be implemented in off-die memories 275 or 280; and in some such examples can be accessed directly by cache controller 215. Data read by the off-die memory controller 220 can be cached in the cache 210 by the cache controller 215 for later use.

The atomic and merge unit 250 are coupled to receive (as input) the output of the off-die memory controller 220, and to provide output to the cache 210, the network communication interface 225, or directly to the chiplet network 285. The memory hazard unit 260, write merge unit 255 and the built-in (e.g., predetermined) atomic unit 265 can each be implemented as state machines with other combinational logic circuitry (such as adders, shifters, comparators, AND gates, OR gates, XOR gates, or any suitable combination thereof) or other logic circuitry. These components can also include one or more registers or buffers to store operand or other data. The PAU 270 can be implemented as one or more processor cores or control circuitry, and various state machines with other combinational logic circuitry or other logic circuitry, and can also include one or more registers, buffers, or memories to store addresses, executable instructions, operand and other data, or can be implemented as a processor.

The write merge unit 255 receives read data and request data, and merges the request data and read data to create a single unit having the read data and the source address to be used in the response or return data packet). The write merge unit 255 provides the merged data to the write port of the cache 210 (or, equivalently, to the cache controller 215 to write to the cache 210). Optionally, the write merge unit 255 provides the merged data to the network communication interface 225 to encode and prepare a response or return data packet for transmission on the chiplet network 285.

When the request data is for a built-in atomic operator, the built-in atomic unit 265 receives the request and reads data, either from the write merge unit 255 or directly from the off-die memory controller 220. The atomic operator is performed, and using the write merge unit 255, the resulting data is written to the cache 210, or provided to the network communication interface 225 to encode and prepare a response or return data packet for transmission on the chiplet network 285.

The built-in atomic unit 265 handles predefined atomic operators such as fetch-and-increment or compare-and-swap. In an example, these operations perform a simple read-modify-write operation to a single memory location of 32-bytes or less in size. Atomic memory operations are initiated from a request packet transmitted over the chiplet network 285. The request packet has a physical address, atomic operator type, operand size, and optionally up to 32-bytes of data. The atomic operator performs the read-modify-write to a cache memory line of the cache 210, filling the cache memory if necessary. The atomic operator response can be a simple completion response, or a response with up to 32-bytes of data. Example atomic memory operators include fetch-and-AND, fetch-and-OR, fetch-and-XOR, fetch-and-add, fetch-and-subtract, fetch-and-increment, fetch-and-decrement, fetch-and-minimum, fetch-and-maximum, fetch-and-swap, and compare-and-swap. In various example embodiments, 32-bit and 64-bit operations are supported, along with operations on 16 or 32 bytes of data. Methods disclosed herein are also compatible with hardware supporting larger or smaller operations and more or less data.

Built-in atomic operators can also involve requests for a "standard" atomic operator on the requested data, such as comparatively simple, single cycle, integer atomics—such as fetch-and-increment or compare-and-swap—which will occur with the same throughput as a regular memory read or write operation not involving an atomic operator. For these operations, the cache controller 215 can generally reserve a cache line in the cache 210 by setting a hazard bit (in hardware), so that the cache line cannot be read by another process while it is in transition. The data is obtained from either the off-die memory 275 or the cache 210, and is provided to the built-in atomic unit 265 to perform the requested atomic operator. Following the atomic operator, in addition to providing the resulting data to the packet encoder 240 to encode outgoing data packets for transmission on the chiplet network 285, the built-in atomic unit 265 provides the resulting data to the write merge unit 255, which will also write the resulting data to the cache 210. Following the writing of the resulting data to the cache 210, any corresponding hazard bit which was set will be cleared by the memory hazard unit 260.

The PAU 270 enables high performance (high throughput and low latency) for programmable atomic operators (also referred to as "custom atomic transactions" or "custom atomic operators"), comparable to the performance of built-in atomic operators. Rather than executing multiple memory accesses, in response to an atomic operator request designating a programmable atomic operator and a memory address, circuitry in the memory controller chiplet 205 transfers the atomic operator request to PAU 270 and sets a hazard bit stored in a memory hazard register corresponding to the memory address of the memory line used in the atomic operator, to ensure that no other operation (read, write, or atomic) is performed on that memory line, which hazard bit is then cleared upon completion of the atomic operator. Additional, direct data paths provided for the PAU 270 executing the programmable atomic operators allow for additional write operations without any limitations imposed by the bandwidth of the communication networks and without increasing any congestion of the communication networks.

The PAU 270 includes a multi-threaded processor, for example, such as a RISC-V ISA based multi-threaded processor, having one or more processor cores, and further having an extended instruction set for executing programmable atomic operators. When provided with the extended instruction set for executing programmable atomic operators, the PAU 270 can be embodied as one or more hybrid threading processors. In some example embodiments, the PAU 270 provides barrel-style, round-robin instantaneous thread switching to maintain a high instruction-per-clock rate.

Programmable atomic operators can be performed by the PAU 270 involving requests for a programmable atomic operator on the requested data. A user can prepare programming code to provide such programmable atomic operators. For example, the programmable atomic operators can be comparatively simple, multi-cycle operations such as floating-point addition, or comparatively complex, multi-instruction operations such as a Bloom filter insert. The programmable atomic operators can be the same as or different than the predetermined atomic operators, insofar as they are defined by the user rather than a system vendor. For these operations, the cache controller 215 can reserve a cache line in the cache 210, by setting a hazard bit (in hardware), so that cache line cannot be read by another process while it is in transition. The data is obtained from either the cache 210 or the off-die memories 275 or 280, and is provided to the PAU 270 to perform the requested programmable atomic operator. Following the atomic operator, the PAU 270 will provide the resulting data to the network communication interface 225 to directly encode outgoing data packets having the resulting data for transmission on the chiplet network 285. In addition, the PAU 270 will provide the resulting data to the cache controller 215, which will also write the resulting data to the cache 210. Following the writing of the resulting data to the cache 210, any corresponding hazard bit which was set will be cleared by the cache control circuit 215.

In selected examples, the approach taken for programmable atomic operators is to provide multiple, generic, custom atomic request types that can be sent through the chiplet network 285 to the memory controller chiplet 205 from an originating source such as a processor or other system component. The cache controllers 215 or off-die memory controller 220 identify the request as a custom atomic and forward the request to the PAU 270. In a representative embodiment, the PAU 270: (1) is a programmable processing element capable of efficiently performing a user defined atomic operator; (2) can perform load and stores to memory, arithmetic and logical operations and control flow decisions; and (3) leverages the RISC-V ISA with a set of new, specialized instructions to facilitate interacting with such controllers 215, 220 to atomically perform the user-defined operation. In desirable examples, the RISC-V ISA contains a full set of instructions that support high level language operators and data types. The PAU 270 can leverage the RISC-V ISA, but will commonly support a more limited set of instructions and limited register file size to reduce the die size of the unit when included within the memory controller chiplet 205.

As mentioned above, prior to the writing of the read data to the cache 210, the set hazard bit for the reserved cache line is to be cleared, by the memory hazard clear unit 260. Accordingly, when the request and read data is received by the write merge unit 255, a reset or clear signal can be transmitted by the memory hazard clear unit 260 to the cache 210 to reset the set memory hazard bit for the reserved cache line. Also, resetting this hazard bit will also release a pending read or write request involving the designated (or reserved) cache line, providing the pending read or write request to an inbound request multiplexer for selection and processing.

Figure 3:
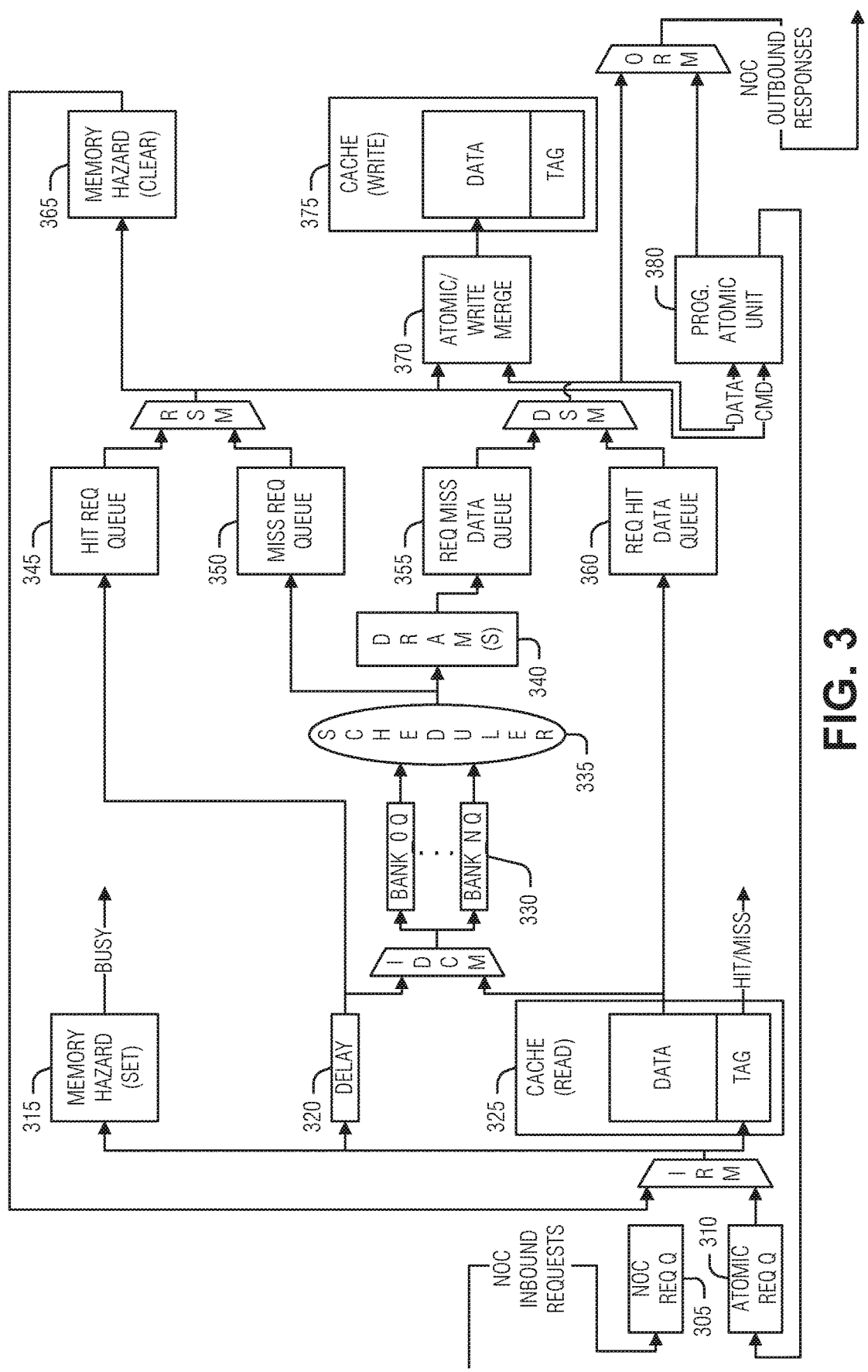
FIG. 3 illustrates components of an example of a memory controller chiplet, according to an embodiment.

FIG. 3 illustrates components of an example of a memory controller chiplet, according to an embodiment. FIG. 3 is another representation of a memory controller from the memory controller 205 illustrated in FIG. 2. Many of the same components shown in FIG. 2 are illustrated here. For example, the cache 302 and 385 are examples of cache 210; DRAM(s) 340 are examples of off-die memory 275-280; atomic/write merge 370 and the programmable atomic unit 380 may be an example of atomics and merge unit 250. Other components of FIG. 3 may be examples of other components of FIG. 2 such as off-die memory controller 220 and cache controller 215.

Other components, not specifically represented in the memory controller 205, can include the following. A NOC Request Queue 305 to receive requests from the network-on-chip and provide a small amount of queuing. An Atomic Request Queue 310 that receives requests from the programmable atomic unit 380 and provides a small amount of queuing. An Inbound Request Multiplexer (IRM) that selects between inbound memory request sources. In an example, the three memory request sources, in order of priority are: Memory Hazard Requests, Atomic Requests, and Inbound NOC Requests.

The Cache (Read) 325 and Cache (Write) 375 are a single device implemented as, in an example, an SRAM data cache. The diagram illustrates the cache as two separate blocks (325 and 375), one providing read access, the other providing write access. A Delay Block 320 provides one or more pipeline stages to mimic the delay for an SRAM cache read operation. Generally, a cache miss accesses to the off-die memory 340 (e.g., off-die memory 280) to bring the desired data into the cache. While waiting for the memory response (e.g., access time for the DRAM 340), the memory line is not available for other requests.

A Memory Hazard block (Hazard Set block 315 and Hazard Clear block 360) can maintain a table of hazard bits indicating which memory lines are unavailable for access. Thus, an inbound request that tries to access a line with a hazard is held by the Memory Hazard block until the hazard is cleared. Once the hazard is cleared then the request is resent through the Inbound Request Multiplexer. In an example, the memory line tag address is hashed to a hazard bit index. The number of hazard bits may be chosen to set the hazard collision probability to a sufficiently low level.

The Memory Hazard Block can also be configured to provide atomicity to PAO resources. To this end, the Memory Hazard Block (e.g., Hazard Set Block 315) is configured to receive a request for a PAO. The received request includes an identifier for the PAO and a memory address (e.g., the base memory address or base address for the PAO). Again, all memory operated on by the PAO is relative to the base memory address. In an example, the request is received via the NOC as a CPI request, such as the CPI request 500 described below with respect to FIG. 5.

The memory Hazard Block is configured to process the memory address to identify a lock value. The lock value is a value that indicates whether or not the resources of the PAO are locked (e.g., in use). In an example, the entry in the lock value is a single bit, such as a logical one meaning that the resources of the PAO are locked and a logical zero meaning that the resources are unlocked.

The memory address is used with a transformation (e.g., the processing) to find the lock value, for example, in a data structure. In an example, processing the memory address to identify the lock value includes hashing the memory address. Hashing the memory address is a direct use of the memory address for a generally more condensed representation of the memory address. This condensed representation can then be used to identify the lock value. The hashing can be performed by the Memory Hazard Block or initiated by the Memory Hazard Block. For example, upon receipt of the PAO request, the PAU 380 can be invoked to perform the hashing and provide the lock value. Other components of the memory controller illustrated here, or in FIG. 2, can also be used to produce the lock value from the memory address in the PAO request.

In an example, the hash corresponds to an entry of a data structure. Thus, the hash produces a value that is a key, or an index, into the data structure. In an example, the data structure is an array. In this example, the memory address is hashed to an integer number that corresponds to an entry of the array. Thus, the memory address is hashed to an index of the array. In this example, the lock value is held in the array at the index.

In an example, the data structure has fewer entries than memory addresses in an addressable space for the memory controller. This example demonstrates the power in using a hash of the memory address rather than the memory address itself. Generally, it is unlikely that all memory addresses in the memory controller will be subject to simultaneous requests. If the memory address were used directly, the data structure would likely maintain many entries that are frequently unused. This results in wasted hardware resources dedicated to maintaining lock values that are rarely consulted. In this example, a fewer number of lock value entries is used than all possible memory addresses, thus reducing the amount of hardware used to store lock values. The hash and the number of total lock value entries in the data structure are adjusted to control collisions. Here, a collision occurs when two different memory address hash to the same lock value. Thus, in this case, two different PAO requests with two different memory addresses can lock on each other. Generally, the smaller the lock value data structure, the greater chance that any two requests will collide. Thus, a smaller data structure to hold lock values is efficient in terms of hardware to house the data structure but can result in greater collisions (e.g., contention) and reduce throughput.

The Memory Hazard Block (e.g., the Memory Hazard Set block 315) is configured to verify that the lock value indicates that there is no lock corresponding to the memory address. Thus, here, a lookup into the data structure can be made using the processed (e.g., hashed) memory address from the PAO request. If the lock value indicates a lock (e.g., a logical one), then the PAO request cannot execute immediately. If the lookup value indicates that there is no lock (e.g., a logical zero), then the PAO request can execute without delay.

The Memory Hazard Block is configured to set the lock value to indicate a lock corresponding to the memory address in response to verifying that the lock value indicates that there is no lock corresponding to the memory address. Setting the lock value generally occurs before execution of the PAO to ensure that there are no race conditions with another PAO request. Accordingly, as soon as the lock value is verified to indicate that there is no lock, the lock value is set on behalf of the PAO request.

Once the lock value for the memory address of the PAO request is set to indicate a lock, the PAO can be invoked, for example, by the PAU 380. Here, other aspects of the request, such as the PAO identifier (e.g., partition), arguments, etc., are obtained (e.g., retrieved by, received by, or provided to) the PAU 380 to execute the PAO.

The Memory Hazard Block (e.g., Memory Hazard Clear Block 365) is configured to set the lock value to indicate that there is no lock corresponding to the memory address in response to completion of the PAO. In an example, the PAU 380 can include a writeback (e.g., register store) instruction that notifies the memory Hazard Block when the PAO is complete. In an example, a component of the memory controller, such as the outbound path of the NOC (e.g., packet encoder 240 of FIG. 2) can signal the Memory Hazard Block when the PAO is complete. In any case, once the PAO completes, the corresponding lock on the memory address is released to enable a next PAO request to proceed.

When a PAO request is received and the lock value indicates that the resources are already locked, the PAO request is held until the resources are freed. The request can be paused while the lock value indicates a lock and resumed when the lock value is cleared. In an example, pausing the second request includes linking the second request to the entry in the data structure that corresponds to the lock value for the memory address. In this example, the linking can be implemented using a variety of techniques. In an example, the entry in the data structure includes a first-in-first-out (FIFO) queue. Here, in addition to the lock value, each index in the array has a FIFO. Thus, the paused PAO request is placed in the FIFO (e.g., enqueued). As the lock value clears, the head of the FIFO is dequeued, the lock value is again set to indicate a lock, and the dequeued PAO request is executed. Thus, as the PAO request reaches the head of the FIFO and is dequeued, the PAO request is resumed.

An Inbound DRAM Control Multiplexer (IDCM) selects from an inbound NOC request and a cache eviction request. For the Bank Request Queues 330, each separately managed DRAM bank has a dedicated bank request queue to hold requests until they can be scheduled on the associated DRAM bank.

The scheduler 335 selects across the bank request queues 335 to choose a request for an available DRAM bank. A Request Hit Data Queue 360 holds request data from cache hits until selected. A Request Miss Data Queue 355 holds data read from the DRAM(s) until selected. A Miss Request Queue 350 is used to hold request packet information for cache misses until the request is selected. A Hit Request Queue 345 holds request packet information for cache hits until selected. A Data Selection Multiplexer (DSM) selects between DRAM read data and cache hit read data. The selected data is written to the SRAM cache. Request Selection Multiplexer (RSM) selects between hit and miss request queues 345 and 355.

The Atomic/Write Merge 370 either merges the request data and DRAM read data, or, if the request is a built-in atomic (e.g., built-in atomic operation block 265), the memory data and request data are used as inputs for an atomic operation. The Cache (Write) block 375 represents the write port for the SRAM cache. Data from a NOC write request and data from DRAM read operations are written to the SRAM cache. The Memory Hazard (Clear) block 365 represents the hazard clear operation for the memory hazard structure. Clearing a hazard may release a pending NOC request and send it to the Inbound Request Multiplexer. The programmable Atomic Unit 380 processes programmable atomic operations (e.g., transactions). The NOC Outbound Response Multiplexer (ORM) selects between memory controller responses and custom atomic unit responses and sends the selection to the NOC.

Figure 4:
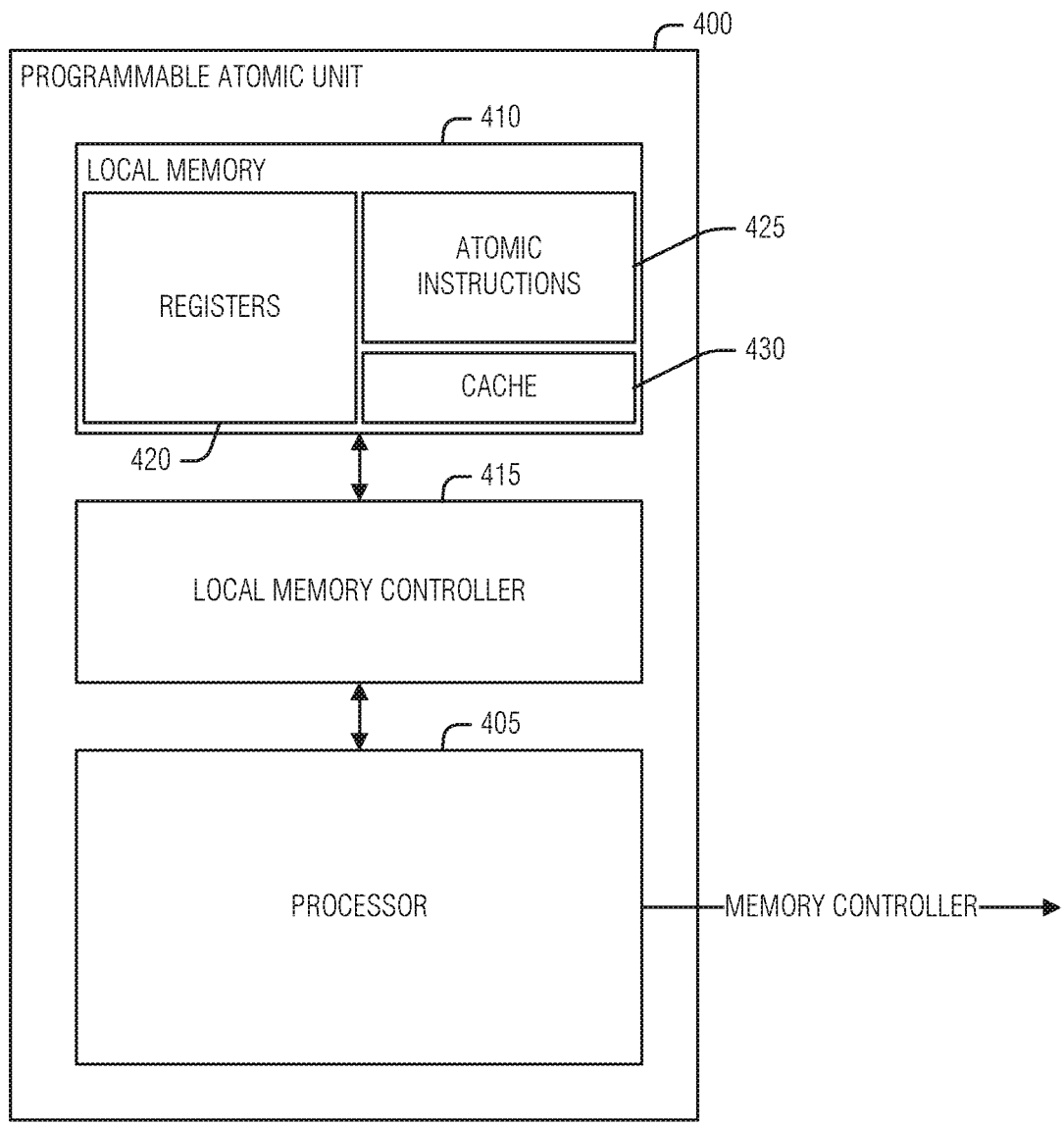
FIG. 4 illustrates components in an example of a programmable atomic unit (PAU), according to an embodiment.

FIG. 4 illustrates components in an example of a programmable atomic unit 400 (PAU), such as those noted above with respect to FIG. 1 (e.g., in the memory controller 140) and FIG. 2 (e.g., PAU 270), according to an embodiment. As illustrated, the PAU 400 includes a processor 405, local memory 410 (e.g., SRAM), and a controller 415 for the local memory 410.

In an example, the processor 405 is a pipelined such that multiple stages of different instructions are executed together per clock cycle. The processor 405 is also a barrel-multithreaded processor, with circuitry to switch between different register files (e.g., sets of registers containing current processing state) upon each clock cycle of the processor 405. This enables efficient context switching between currently executing threads. In an example, the processor 405 supports eight threads, resulting in eight register files. In an example, some or all of the register files are not integrated into the processor 405, but rather reside in the local memory 410 (registers 420). This reduces circuit complexity in the processor 405 by eliminating the traditional flip-flops used for these registers 420.

The local memory 410 can also house a cache 430 and instructions 425 for atomic operators. The atomic instructions 425 comprise sets of instructions to support the various application-loaded atomic operators. When an atomic operator is requested—by the application chiplet 125, for example—a set of instructions (e.g., a kernel) corresponding to the atomic operator are executed by the processor 405. In an example, the atomic instructions 425 are partitioned to establish the sets of instructions. In this example, the specific programmable atomic operator being requested by a requesting process can identify the programmable atomic operator by the partition number. The partition number can be established when the programmable atomic operator is registered with (e.g., loaded onto) the PAU 400. Additional metadata for the programmable atomic instructions 425 can also be stored in the local memory 410, such as the partition tables.

Atomic operators manipulate the cache 430, which is generally synchronized (e.g., flushed) when a thread for an atomic operator completes. Thus, aside from initial loading from the external memory, such as the off-die memory 275 or 280, latency is reduced for most memory operations during execution of a programmable atomic operator thread.

Figure 5:
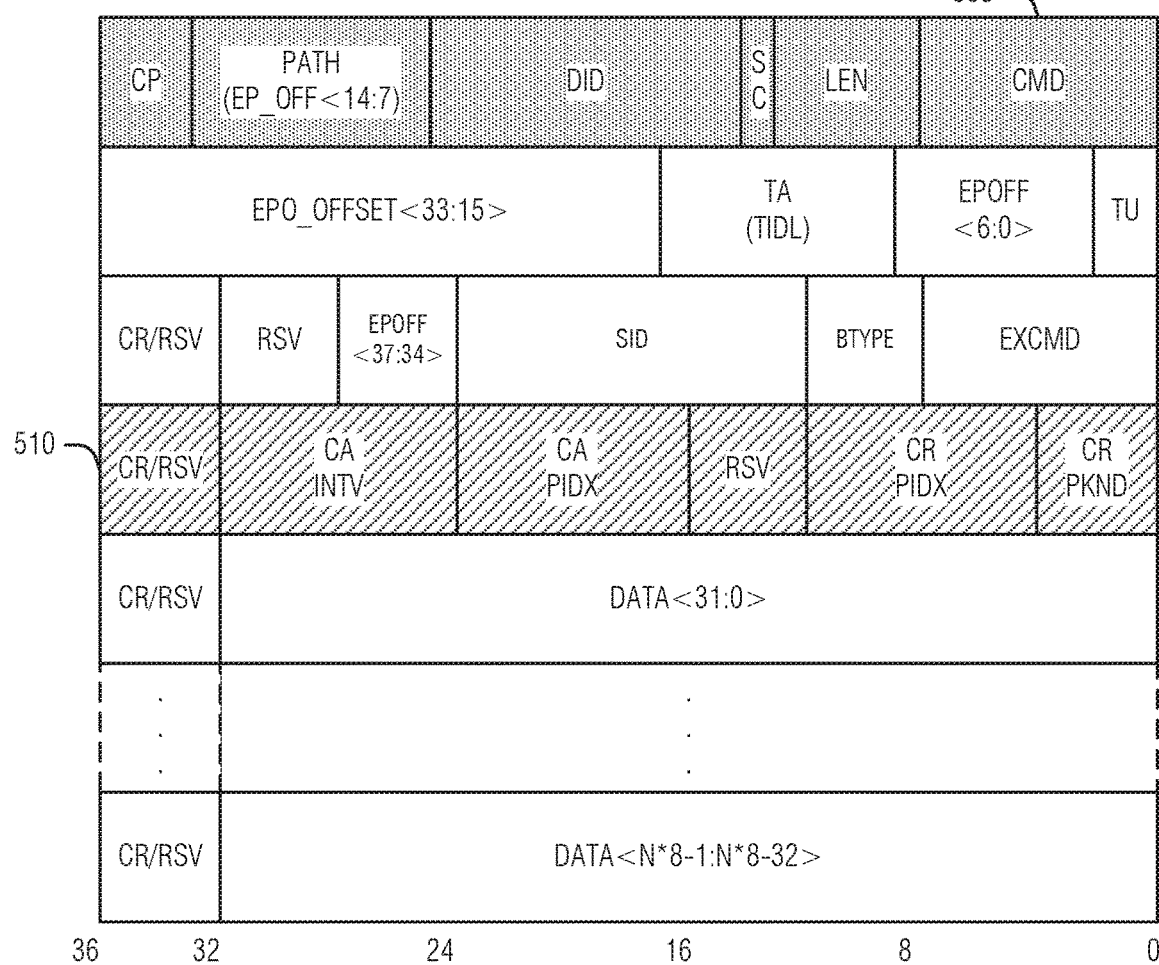
FIG. 5 illustrates a chiplet protocol interface request packet, according to an embodiment.

FIG. 5 illustrates a chiplet protocol interface request packet 500, according to an embodiment. The following is a table for an example of CPI field descriptions and bit lengths corresponding to the CPI request packet 500.

| Field Name | Field Width | Value | Field Description |
|---|---|---|---|
| Line 1 | | | |
| CMD | 8 | 126 | Extended virtual channel 1 (VC1) |
| LEN | 5 | | Packet Length |

| Field Name | Field Width | Value | Field Description |
| --- | --- | --- | --- |
| SC | 1 | 0 | Sequence Continue (ignored for external memory device (EMD)) |
| DID | 12 | | Destination NOC endpoint |
| PATH | 8 | | Endpoint Offset <14:7> |
| CP | 2 | 1 | Credit/Path Order (Credit Return enabled in flits 3-N and PATH field based path ordering) |
| Line 2 | | | |
| TU | 2 | | Transaction ID <9:8> |
| EPOff <6:0> | 7 | | Endpoint Offset <6:0> |
| TA | 8 | | Transaction IS <7:0> |
| EpOffset <33:15> | 19 | | Endpoint Offset <33:15> |
| Line 3 | | | |
| EXCMD | 8 | | Extended Command |
| BTYPE | 4 | 8 | BTYPE of 8 is EMD vendor defined |
| SID | 12 | | Source NOC Endpoint |
| EpOffset <37:34> | 4 | | Endpoint Offset <37:34> |
| RSV | 4 | 0 | Reserved |
| CR/RSV | 4 | | Credit Return |
| Line 4 | | | |
| CrPKnd | 4 | | Credit Pool Kind |
| CrPIdx | 8 | | Credit Pool Index |
| RSV | 4 | 0 | Reserved |
| CaPIdx | 8 | | Custom (Programmable) Atomic Partition Index |
| CaIntv | 8 | | Interleave Size |
| CR/RSV | 4 | | Credit Return |
| Lines 5 and Beyond | | | |
| DATA | 32 | | Argument data: 0, 1, 2, or 4, 64-bit values |
| CR/RSV | 4 | | Credit Return |

As illustrated, line 4, the shaded line is an extended header 510. The command field 505 indicates that the request 500 is for a PAO. However, the entity decoding the request 500 and providing the PAO parameter to a PAU (e.g., PAU 270) will either pass the extended header 510 information to the PAU or decode the extended header 510 and provide the constituent fields as inputs to the PAU.

Figure 6:
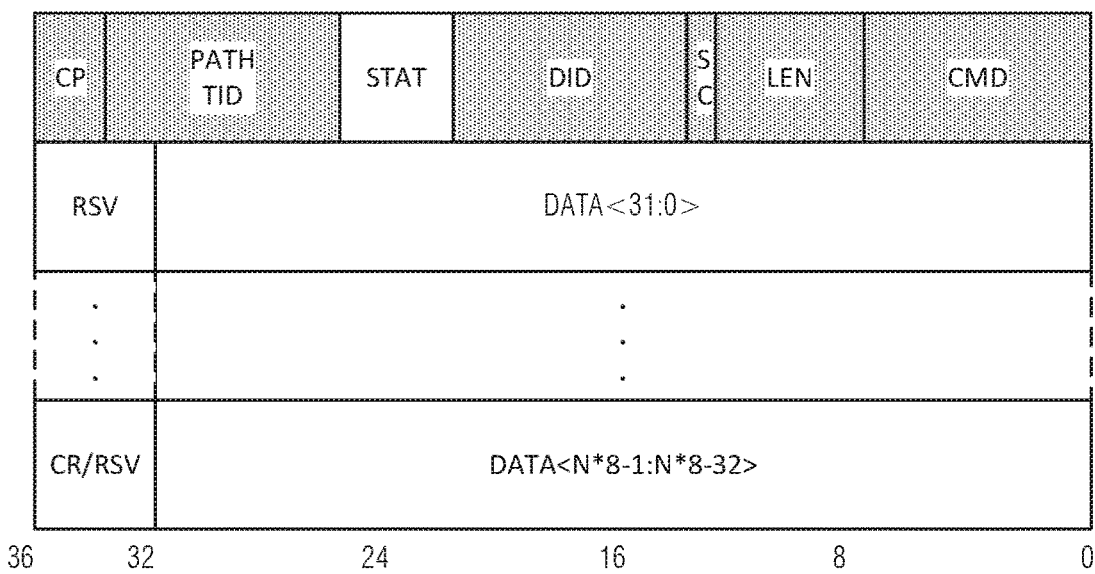
FIG. 6 illustrates a chiplet protocol interface response packet, according to an embodiment.

FIG. 6 illustrates a chiplet protocol interface response packet 600, according to an embodiment. The following is a table for an example of CPI field descriptions and bit lengths corresponding to the CPI response packet 600.

| Field Name | Field Width | Field Description |
| --- | --- | --- |
| Line 1 | | |
| CMD | 8 | Packet command |
| LEN | 5 | Encoded packet Length |
| SC | 1 | Sequence Continue. When set, this packet is part of a multi-packet transfer and this packet is not the last packet in the sequence. In an example, this bit is present in the first flit of all packet types. |
| DID | 8 | Destination NOC Endpoint ID bits <7:0> |
| STAT | 4 | Response Status |
| PATH TID | 8 | The PATH field used to specify a path through a CPI fabric to force ordering between packets. For both CPI native and AXI over CPI, the read response packet's PATH field can contain a transaction identifier (TID) value. |
| CP | 2 | Credit Present/Path Ordering. The CP field contains an encoded value that specifies both whether the field CR of flits 3-N of the packet contains credit return information and whether path ordering is enabled. |
| Lines 2 and beyond | | |
| DATA | 32 | Read Response Data, bits N*8-1:0 |
| CR/RSV | 4 | Credit Return Information |
| RSV | 4 | Reserved |

Figure 7:
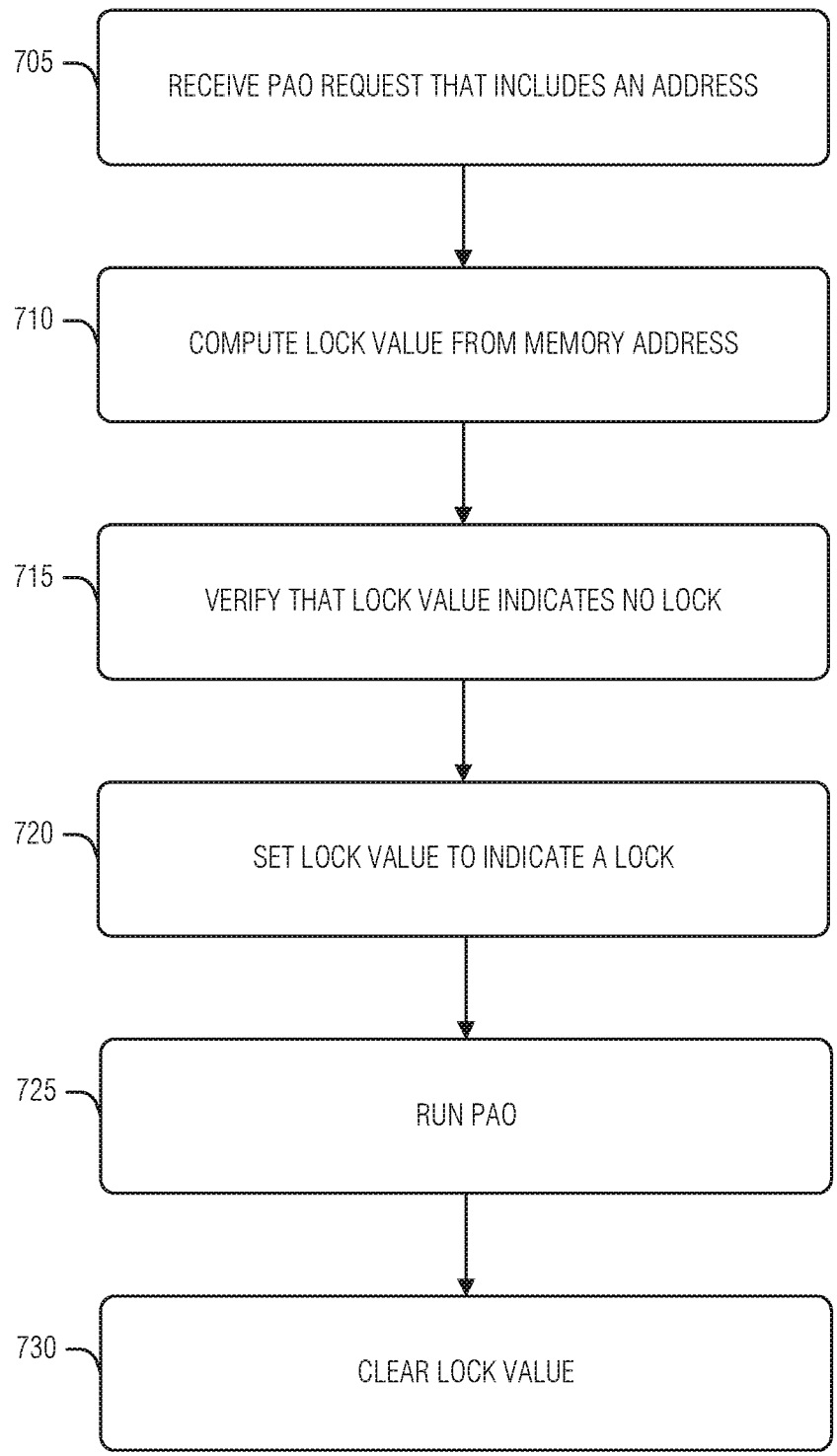
FIG. 7 is a flow chart of an example of a method for programmable atomic operator resource locking according to an embodiment.

FIG. 7 is a flow chart of an example of a method 700 for programmable atomic operator resource locking according to an embodiment. Operations of the method 700 are performed by computer hardware, such as that described with respect to FIG. 1 (e.g., memory controller chiplet), FIG. 2, FIG. 3, FIG. 4 (e.g., PAU 400), or FIG. 8 (e.g., processing circuitry).

At operation 705, a request for a PAO is received (e.g., a memory controller that includes a PAU). Here, the request includes an identifier for the PAO and a memory address. An example of the request is the CPI request 500 described below with respect to FIG. 5.

At operation 710, the memory address is processed to identify a lock value. In an example, processing the memory address to identify the lock value includes hashing the memory address to an entry of a data structure. In an example, the data structure is an array. In this example, hashing the memory address to the entry of the data structure includes hashing the memory address to an index of the array. In an example, the data structure has fewer entries than memory addresses in an addressable space for the memory controller. In an example, the lock value is a single bit.

At operation 715, a verification is made that the lock value indicates that there is no lock corresponding to the memory address.

At operation 720, in response to receipt of the request and verification that the lock value indicates that there is no lock corresponding to the memory address, the lock value is set to indicate that there is a lock corresponding to the memory address.

At operation 725, the PAO is invoked based on the identifier for the PAO.

At operation 730, in response to completion of the PAO, the lock value is set to indicate that there is no lock corresponding to the memory address.

In an example, the operations of the method 700 can be extended include receiving a second request for the PAO. Here, the second request includes the memory address and the identifier for the PAO and arrives before completion of the PAO invoked from the request. Then the memory address of the second request can be processed to identify the lock value. Another verification that the lock value indicates that there is a lock corresponding to the memory address can be performed. In response to the verification that the lock value indicates that there is already a lock corresponding to the memory address, the second request is paused. The second request is resumed when the lock value indicates that there is no lock corresponding to the memory address. In an example, pausing the second request includes linking the second request to an entry in a data structure that corresponds to the lock value for the memory address. In an example, the entry is a first-in-first-out (FIFO) queue. In this example, linking the second request to the entry in the data structure includes enqueueing the second request into the FIFO. In an example, resuming the second request occurs when the second request is at a head of the queue (e.g., is dequeued).

Figure 8:
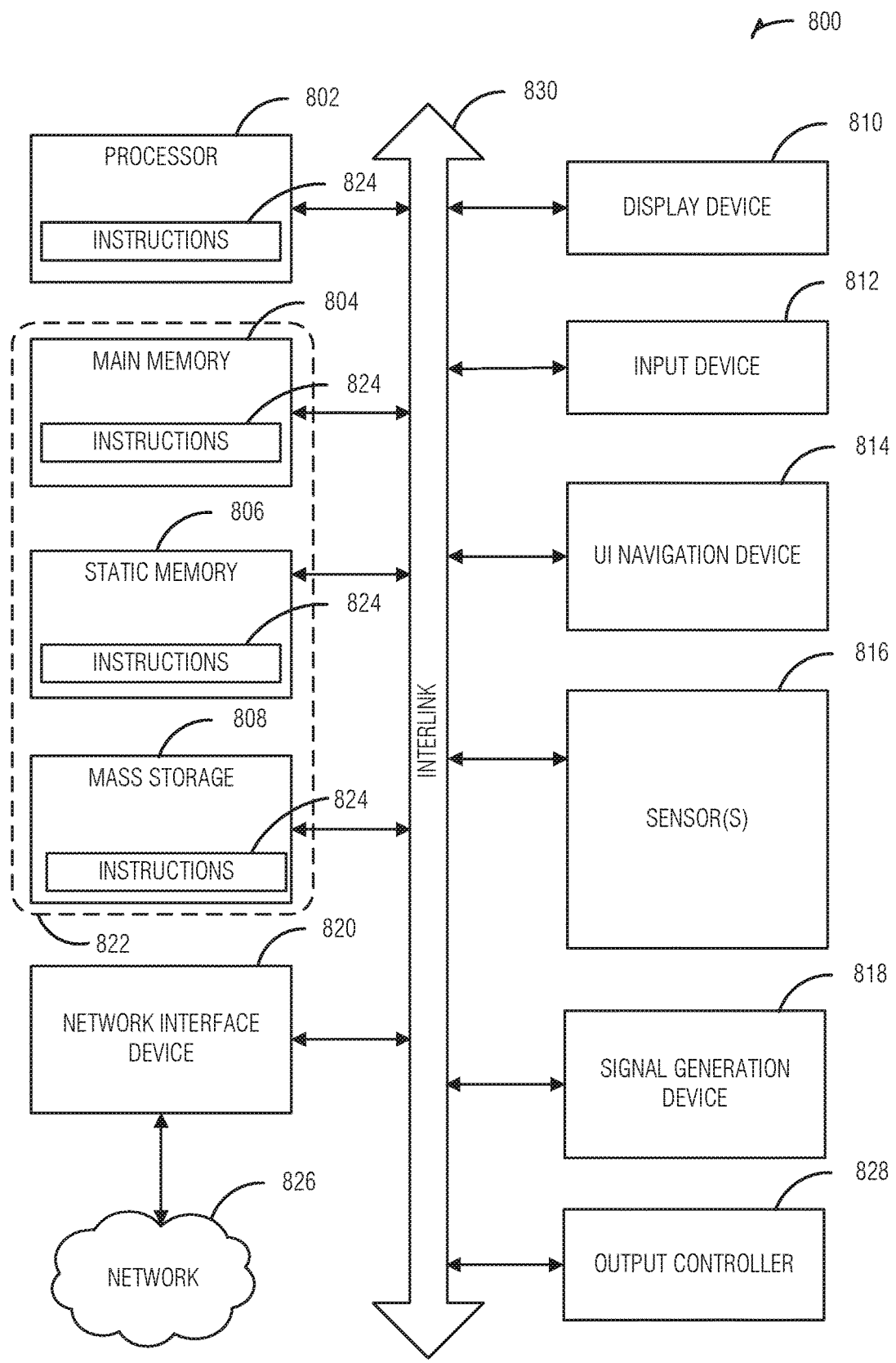
FIG. 8 is a block diagram of an example of a machine with which, in which, or by which embodiments of the present disclosure can operate.

FIG. 8 illustrates a block diagram of an example machine 800 with which, in which, or by which any one or more of the techniques (e.g., methodologies) discussed herein can be implemented. Examples, as described herein, can include, or can operate by, logic or a number of components, or mechanisms in the machine 800. Circuitry (e.g., processing circuitry) is a collection of circuits implemented in tangible entities of the machine 800 that include hardware (e.g., simple circuits, gates, logic, etc.). Circuitry membership can be flexible over time. Circuitries include members that can, alone or in combination, perform specified operations when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time. Additional examples of these components with respect to the machine 800 follow.

In alternative embodiments, the machine 800 can operate as a standalone device or can be connected (e.g., networked) to other machines. In a networked deployment, the machine 800 can operate in the capacity of a server machine, a client machine, or both in server-client network environments. In an example, the machine 800 can act as a peer machine in peer-to-peer (P2P) (or other distributed) network environment. The machine 800 can be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 800 can include a hardware processor 802 (e.g., a central processing unit (CPU), a graphics processing unit (GPU), a hardware processor core, or any combination thereof), a main memory 804, a static memory (e.g., memory or storage for firmware, microcode, a basic-input-output (BIOS), unified extensible firmware interface (UEFI), etc.) 806, and mass storage 808 (e.g., hard drives, tape drives, flash storage, or other block devices) some or all of which can communicate with each other via an interlink (e.g., bus) 830. The machine 800 can further include a display unit 810, an alphanumeric input device 812 (e.g., a keyboard), and a user interface (UI) navigation device 814 (e.g., a mouse). In an example, the display unit 810, input device 812 and UI navigation device 814 can be a touch screen display. The machine 800 can additionally include a storage device (e.g., drive unit) 808, a signal generation device 818 (e.g., a speaker), a network interface device 820, and one or more sensors 816, such as a global positioning system (GPS) sensor, compass, accelerometer, or other sensor. The machine 800 can include an output controller 828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 802, the main memory 804, the static memory 806, or the mass storage 808 can be, or include, a machine readable medium 822 on which is stored one or more sets of data structures or instructions 824 (e.g., software) embodying or utilized by any one or more of the techniques or functions described herein. The instructions 824 can also reside, completely or at least partially, within any of registers of the processor 802, the main memory 804, the static memory 806, or the mass storage 808 during execution thereof by the machine 800. In an example, one or any combination of the hardware processor 802, the main memory 804, the static memory 806, or the mass storage 808 can constitute the machine readable media 822. While the machine readable medium 822 is illustrated as a single medium, the term "machine readable medium" can include a single medium or multiple media (e.g., a centralized or distributed database, or associated caches and servers) configured to store the one or more instructions 824.

The term "machine readable medium" can include any medium that is capable of storing, encoding, or carrying instructions for execution by the machine 800 and that cause the machine 800 to perform any one or more of the techniques of the present disclosure, or that is capable of storing, encoding or carrying data structures used by or associated with such instructions. Non-limiting machine readable medium examples can include solid-state memories, optical media, magnetic media, and signals (e.g., radio frequency signals, other photon based signals, sound signals, etc.). In an example, a non-transitory machine readable medium comprises a machine readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media can include: non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks.

In an example, information stored or otherwise provided on the machine readable medium 822 can be representative of the instructions 824, such as instructions 824 themselves or a format from which the instructions 824 can be derived. This format from which the instructions 824 can be derived can include source code, encoded instructions (e.g., in compressed or encrypted form), packaged instructions (e.g., split into multiple packages), or the like. The information representative of the instructions 824 in the machine readable medium 822 can be processed by processing circuitry into the instructions to implement any of the operations discussed herein. For example, deriving the instructions 824 from the information (e.g., processing by the processing circuitry) can include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 824.

In an example, the derivation of the instructions 824 can include assembly, compilation, or interpretation of the information (e.g., by the processing circuitry) to create the instructions 824 from some intermediate or preprocessed format provided by the machine readable medium 822. The information, when provided in multiple parts, can be combined, unpacked, and modified to create the instructions 824. For example, the information can be in multiple compressed source code packages (or object code, or binary executable code, etc.) on one or several remote servers. The source code packages can be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 824 can be further transmitted or received over a communications network 826 using a transmission medium via the network interface device 820 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), plain old telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 820 can include one or more physical jacks (e.g., Ethernet, coaxial, or phone jacks) or one or more antennas to connect to the communications network 826. In an example, the network interface device 820 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 800, and includes digital or analog communications signals or other intangible medium to facilitate communication of such software. A transmission medium is a machine readable medium.

Example 1 is an apparatus comprising: an interface configured to receive a request for a programmable atomic operator (PAO), the request sent to a memory controller and including an identifier for the PAO and a memory address; a data structure configured to hold a lock value; hazard circuitry configured to: process the memory address to identify the lock value; verify that the lock value indicates that there is no lock corresponding to the memory address; set, in response to receipt of the request and verification that the lock value indicates that there is no lock corresponding to the memory address, the lock value to indicate that there is a lock corresponding to the memory address; and set, in response to completion of the PAO, the lock value to indicate that there is no lock corresponding to the memory address; and a programmable atomic unit configured to invoke the PAO based on the identifier for the PAO.

In Example 2, the subject matter of Example 1, wherein, to process the memory address to identify the lock value, the hazard circuitry is configured to hash the memory address to an entry of a data structure.

In Example 3, the subject matter of Example 2, wherein the data structure is an array, and the hash of the memory address is an index of the array.

In Example 4, the subject matter of any of Examples 2-3, wherein the data structure has fewer entries than memory addresses in an addressable space for the memory controller.

In Example 5, the subject matter of any of Examples 2-4, wherein the lock value is a single bit.

In Example 6, the subject matter of any of Examples 1-5, wherein: the interface is configured to receive a second request for the PAO, the second request including the memory address and the identifier for the PAO, the second request arriving before completion of the PAO invoked from the request; and the hazard circuitry is configured to: process the memory address of the second request to identify the lock value; verify that the lock value indicates that there is a lock corresponding to the memory address; pause, in response to the verification that the lock value indicates that there is a lock corresponding to the memory address, the second request; and resume the second request when the lock value indicates that there is no lock corresponding to the memory address.

In Example 7, the subject matter of Example 6, wherein, to pause the second request, the hazard circuitry is configured to link the second request to an entry in a data structure that corresponds to the lock value for the memory address.

In Example 8, the subject matter of Example 7, wherein the entry is a first-in-first-out (FIFO) queue, and wherein, to link the second request to the entry in the data structure, the hazard circuitry is configured to enqueue the second request.

In Example 9, the subject matter of Example 8, wherein the second request is resumed when the second request is at a head of the queue.

Example 10 is a method comprising: receiving, at a memory controller that includes a programmable atomic unit (PAU), a request for a programmable atomic operator (PAO), the request including an identifier for the PAO and a memory address; processing the memory address to identify a lock value; verifying that the lock value indicates that there is no lock corresponding to the memory address; setting, in response to receipt of the request and verification that the lock value indicates that there is no lock corresponding to the memory address, the lock value to indicate that there is a lock corresponding to the memory address; invoking the PAO based on the identifier for the PAO; and setting, in response to completion of the PAO, the lock value to indicate that there is no lock corresponding to the memory address.

In Example 11, the subject matter of Example 10, wherein processing the memory address to identify the lock value includes hashing the memory address to an entry of a data structure.

In Example 12, the subject matter of Example 11, wherein the data structure is an array, and wherein hashing the memory address to the entry of the data structure includes hashing the memory address to an index of the array.

In Example 13, the subject matter of any of Examples 11-12, wherein the data structure has fewer entries than memory addresses in an addressable space for the memory controller.

In Example 14, the subject matter of any of Examples 11-13, wherein the lock value is a single bit.

In Example 15, the subject matter of any of Examples 10-14, comprising: receiving a second request for the PAO, the second request including the memory address and the identifier for the PAO, the second request arriving before completion of the PAO invoked from the request; processing the memory address of the second request to identify the lock value; verifying that the lock value indicates that there is a lock corresponding to the memory address; pausing, in response to the verification that the lock value indicates that there is a lock corresponding to the memory address, the second request; and resuming the second request when the lock value indicates that there is no lock corresponding to the memory address.

In Example 16, the subject matter of Example 15, wherein pausing the second request includes linking the second request to an entry in a data structure that corresponds to the lock value for the memory address.

In Example 17, the subject matter of Example 16, wherein the entry is a first-in-first-out (FIFO) queue, and wherein linking the second request to the entry in the data structure includes enqueueing the second request.

In Example 18, the subject matter of Example 17, wherein resuming the second request occurs when the second request is at a head of the queue.

Example 19 is a machine-readable medium including instructions that, when executed by circuitry of a memory controller, cause the memory controller to perform operations: receiving a request for a programmable atomic operator (PAO), the request including an identifier for the PAO and a memory address; processing the memory address to identify a lock value; verifying that the lock value indicates that there is no lock corresponding to the memory address; setting, in response to receipt of the request and verification that the lock value indicates that there is no lock corresponding to the memory address, the lock value to indicate that there is a lock corresponding to the memory address; invoking the PAO based on the identifier for the PAO; and setting, in response to completion of the PAO, the lock value to indicate that there is no lock corresponding to the memory address.

In Example 20, the subject matter of Example 19, wherein processing the memory address to identify the lock value includes hashing the memory address to an entry of a data structure.

In Example 21, the subject matter of Example 20, wherein the data structure is an array, and wherein hashing the memory address to the entry of the data structure includes hashing the memory address to an index of the array.

In Example 22, the subject matter of any of Examples 20-21, wherein the data structure has fewer entries than memory addresses in an addressable space for the memory controller.

In Example 23, the subject matter of any of Examples 20-22, wherein the lock value is a single bit.

In Example 24, the subject matter of any of Examples 19-23, wherein the operations comprise: receiving a second request for the PAO, the second request including the memory address and the identifier for the PAO, the second request arriving before completion of the PAO invoked from the request; processing the memory address of the second request to identify the lock value; verifying that the lock value indicates that there is a lock corresponding to the memory address; pausing, in response to the verification that the lock value indicates that there is a lock corresponding to the memory address, the second request; and resuming the second request when the lock value indicates that there is no lock corresponding to the memory address.

In Example 25, the subject matter of Example 24, wherein pausing the second request includes linking the second request to an entry in a data structure that corresponds to the lock value for the memory address.

In Example 26, the subject matter of Example 25, wherein the entry is a first-in-first-out (FIFO) queue, and wherein linking the second request to the entry in the data structure includes enqueueing the second request.

In Example 27, the subject matter of Example 26, wherein resuming the second request occurs when the second request is at a head of the queue.

Example 28 is a system comprising: means for receiving, at a memory controller that includes a programmable atomic unit (PAU), a request for a programmable atomic operator (PAO), the request including an identifier for the PAO and a memory address; means for processing the memory address to identify a lock value; means for verifying that the lock value indicates that there is no lock corresponding to the memory address; means for setting, in response to receipt of the request and verification that the lock value indicates that there is no lock corresponding to the memory address, the lock value to indicate that there is a lock corresponding to the memory address; means for invoking the PAO based on the identifier for the PAO; and means for setting, in response to completion of the PAO, the lock value to indicate that there is no lock corresponding to the memory address.

In Example 29, the subject matter of Example 28, wherein the means for processing the memory address to identify the lock value include means for hashing the memory address to an entry of a data structure.

In Example 30, the subject matter of Example 29, wherein the data structure is an array, and wherein the means for hashing the memory address to the entry of the data structure include means for hashing the memory address to an index of the array.

In Example 31, the subject matter of any of Examples 29-30, wherein the data structure has fewer entries than memory addresses in an addressable space for the memory controller.

In Example 32, the subject matter of any of Examples 29-31, wherein the lock value is a single bit.

In Example 33, the subject matter of any of Examples 28-32, comprising: means for receiving a second request for the PAO, the second request including the memory address and the identifier for the PAO, the second request arriving before completion of the PAO invoked from the request; means for processing the memory address of the second request to identify the lock value; means for verifying that the lock value indicates that there is a lock corresponding to the memory address; means for pausing, in response to the verification that the lock value indicates that there is a lock corresponding to the memory address, the second request; and means for resuming the second request when the lock value indicates that there is no lock corresponding to the memory address.

In Example 34, the subject matter of Example 33, wherein the means for pausing the second request includes means for linking the second request to an entry in a data structure that corresponds to the lock value for the memory address.

In Example 35, the subject matter of Example 34, wherein the entry is a first-in-first-out (FIFO) queue, and wherein the means for linking the second request to the entry in the data structure include means for enqueueing the second request.

In Example 36, the subject matter of Example 35, wherein resuming the second request occurs when the second request is at a head of the queue.

Example 37 is at least one machine-readable medium including instructions that, when executed by processing circuitry, cause the processing circuitry to perform operations to implement of any of Examples 1-36.

Example 38 is an apparatus comprising means to implement of any of Examples 1-36.

Example 39 is a system to implement of any of Examples 1-36.

Example 40 is a method to implement of any of Examples 1-36.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A memory controller comprising:
an interface configured to receive a request for a programmable atomic operator, the request including a memory address;
circuitry configured to:
read a lock value based on the memory address in the request, the lock value indicating a lock for the programmable atomic operator;
hold the request based on the lock value indicating the lock for the programmable atomic operator, the hold preventing the request from being scheduled; and
release the request based on the lock value indicating that there is no lock, the lock value being changed based on a result of another request for the programmable atomic operator;
scheduler circuitry configured to schedule the request to a programmable atomic unit; and
a programmable atomic unit configured to invoke the programmable atomic operator based on the request.

2. The memory controller of claim 1, comprising a second interface configured to communicate with memory, the memory including a unit of memory corresponding to the memory address.

3. The memory controller of claim 2, wherein the memory is a collection of static random access memory (SRAM) devices or a collection of dynamic random access memory (DRAM) devices.

4. The memory controller of claim 1, wherein the lock value is a single bit.

5. The memory controller of claim 1, wherein the lock value is stored in an entry in a data structure.

6. The memory controller of claim 5, wherein the entry is referenced in the data structure by a hash of the memory address in the request.

7. The memory controller of claim 6, wherein multiple memory addresses hash to the entry.

8. The memory controller of claim 5, wherein the entry includes an ordered list of lock values, elements of the ordered list corresponding to requests received at the interface for the memory address.

9. The memory controller of claim 8, wherein the ordered list is ordered by a time of arrival of the requests.

10. The memory controller of claim 8, wherein, to release the request, the circuitry is configured to release the request based on a position of the lock value in the ordered list indicating that the request is next to be processed.

11. Hazard circuitry comprising:
a memory to hold lock values;
an input interface to receive a request that includes an address;
an output interface to a scheduler of requests; and
circuitry to:
read a lock value from the memory based on the address in the request received on the input interface;
hold, by a first signal to the scheduler via the output interface, the request based on the lock value indicating a lock, the hold preventing the request from being scheduled by the scheduler; and
release, by a signal to the scheduler via the output interface, the request based on the lock value indicating that there is no lock, the lock value being changed based on a result of another request.

12. The hazard circuitry of claim 11, wherein the hazard circuitry is included in a memory controller that includes a programmable atomic unit (PAU).

13. The hazard circuitry of claim 12, wherein the request is a programmable atomic operator invocation on the PAU, and wherein the address is a memory address.

14. The hazard circuitry of claim 12, wherein the memory controller is a chiplet in a chiplet system.

15. The hazard circuitry of claim 11, wherein the lock value is stored in an entry in a data structure in the memory.

16. The hazard circuitry of claim 15, wherein the entry is referenced in the data structure by a hash of the address in the request.

17. The hazard circuitry of claim 16, wherein multiple addresses hash to the entry.

18. The hazard circuitry of claim 15, wherein the entry includes an ordered list of lock values, elements of the ordered list corresponding to requests received at the input interface for the address.

19. The hazard circuitry of claim 18, wherein the ordered list is ordered by a time of arrival of the requests.

20. The hazard circuitry of claim 18, wherein, to release the request, the circuitry is configured to release the request based on a position of the lock value in the ordered list indicating that the request is next to be processed.

* * * * *